United States Patent [19]

Roberson, Jr. et al.

[11] Patent Number: 4,977,688

[45] Date of Patent: Dec. 18, 1990

[54] VAPOR DEVICE AND METHOD FOR DRYING ARTICLES SUCH AS SEMICONDUCTOR WAFERS WITH SUBSTANCES SUCH AS ISOPROPYL ALCOHOL

[75] Inventors: Glenn A. Roberson, Jr., Hollister; Robert B. Eglinton, Montery, both of Calif.

[73] Assignee: Semifab Incorporated, Hollister, Calif.

[21] Appl. No.: 427,512

[22] Filed: Oct. 27, 1989

[51] Int. Cl.⁵ ............................................. F26B 13/30
[52] U.S. Cl. .......................................... 34/92; 34/75; 34/76; 134/21
[58] Field of Search .................... 34/75, 76, 77–78, 34/92; 134/21, 32, 40, 105

[56] References Cited

U.S. PATENT DOCUMENTS

| | | |
|---|---|---|
| 2,953,502 | 9/1960 | Binning et al. . |
| 2,981,680 | 4/1961 | Binning . |
| 3,035,060 | 5/1962 | Binning et al. . |
| 4,067,805 | 1/1978 | Chiang et al. . |
| 4,138,306 | 2/1979 | Niwa . |
| 4,322,251 | 3/1982 | Elliott . |
| 4,424,633 | 1/1984 | Bernhardt et al. ..................... 34/75 |
| 4,512,812 | 4/1985 | Liebert et al. ......................... 134/21 |
| 4,615,768 | 10/1986 | McCord . |
| 4,643,774 | 2/1987 | Kishida et al. . |
| 4,715,392 | 12/1987 | Abe et al. . |
| 4,736,758 | 4/1988 | Kusuhara . |
| 4,777,970 | 10/1988 | Kusuhara . |
| 4,788,043 | 11/1988 | Kagiyama et al. . |
| 4,816,081 | 3/1989 | Mehta et al. .......................... 34/92 |
| 4,879,004 | 11/1989 | Oesch et al. .......................... 134/21 |

OTHER PUBLICATIONS

Clean and Dry Trebor's Hydrodry 5000 System dated Jun. 1987.

Primary Examiner—Henry C. Yuen
Attorney, Agent, or Firm—Finnegan, Henderson, Farabow, Garrett & Dunner

[57] ABSTRACT

A device for drying articles such as semiconductor wafers comprising a vacuum process chamber for holding articles to be dried; a vapor generator substantially isolated from the process chamber for supplying a substance such as isopropyl alcohol in vapor form to the process chamber; a heater for heating the walls of the process chamber to discourage the substance vapor from condensing on the inside walls of the process chamber. The device can also be used for rinsing and cleansing articles prior to drying.

30 Claims, 3 Drawing Sheets

VAPOR DEVICE AND METHOD FOR DRYING ARTICLES SUCH AS SEMICONDUCTOR WAFERS WITH SUBSTANCES SUCH AS ISOPROPYL ALCOHOL

BACKGROUND OF THE INVENTION

1 Field of the Invention

The present invention relates to a vapor device and method for drying articles such as semiconductor wafers with substances such as isopropyl alcohol. The invention may also be used to cleanse and rinse the articles prior to drying.

2 Description of the Related Art

The process for manufacturing semiconductor wafers made of materials such as silicon typically requires a chemical treatment step followed by the steps of rinsing and drying the wafers. In related art devices and methods, after the wafers are rinsed with deionized water, they are placed on a movable transport elevator and lowered into a vapor drying tank. The vapor drying tank, which may be made of quartz, includes a deep lower pan for holding a volatile drying liquid such as isopropyl alcohol (IPA). The wafers are lowered to a position above the pan, and the IPA in the pan is heated to its boiling point. Heating causes the IPA to vaporize, and vaporized IPA is absorbed by the cool deionized water on the wafer surfaces. As this liquefying process continues, the deionized water loses its surface tension and shears off of the wafer surfaces. Ultimately, all moisture adhering to the wafers is displaced with IPA. The remaining IPA quickly evaporates providing moisture-free wafer surfaces.

After a predetermined time, the movable transport elevator raises the wafer from the tank. Typically, some IPA remains on the wafer surfaces in a molecular thickness. This requires that the wafers be dried for an additional period of time in nitrogen or ambient air.

There are a number of drawbacks with the above-mentioned related art devices and methods. First, the deionized water displaced from the wafer and wafer carrier as well as the absorption of water moisture in the atmosphere causes a gradual increase in the water moisture concentration of the IPA. As the moisture concentration of the IPA increases, the wafer-drying performance of the system decreases.

Another drawback of the related art devices and methods is a susceptibility to fire due to the volatility of the IPA vapor. The boiling point of IPA is 82.5° C. with a flash point at ambient pressure of 22.2° C. To adequately generate the necessary IPA vapor, the heaters on the tank must maintain temperatures exceeding 100° C., well above the flash point of IPA. This necessitates constant monitoring and control of vapor concentrations during operation to avoid a fire or explosion.

SUMMARY OF THE INVENTION

Accordingly, it is an object of the present invention to provide a device and method for drying articles such as semiconductor wafers in a controlled environment in which the wafers may be dried at reduced temperatures and pressures.

Another object of the present invention is to continuously provide fresh IPA to the process chamber to minimize the water moisture concentration of the IPA used for drying.

A further object of the present invention is to provide a drainage system for removing spent IPA and deionized water from the process chamber prior to final dehydration so that heat and a vacuum can be used to complete the drying process without removing the wafers from the process chamber.

Yet another object of the present invention is a device and method that reduces the presence of air or oxygen in the process chamber during the drying process. This brings oxygen levels below the point of sustaining combustion.

An object of the present invention is to decrease the possibility of IPA vapor escaping from the process chamber and entering surrounding areas, reducing the risk of explosion or fire.

The objects and advantages of the present invention may be realized and attained by means of the instrumentalities and combinations particularly pointed out in the appended claims.

In accordance with the present invention, as embodied and broadly described herein, the device for drying articles such as semiconductor wafers comprises a vacuum process chamber for holding the article to be dried, vapor generator means substantially isolated from the process chamber for supplying a substance such as isopropyl alcohol, in vapor form, to the process chamber, and means disposed proximate said process chamber for preventing the substance vapor from condensing on the inside walls of the process chamber. An infrared heater may also be provided to aid in vaporizing liquid surfaces during a final dehydration step.

The method of the present invention includes the steps of evacuating air from the process chamber, supplying the vapor of a substance such as IPA to the process chamber from a source external to the chamber, heating the walls of the process chamber to prevent the substance from condensing on the walls of the process chamber, and evacuating liquid from the process chamber. The present method can further include the step of heating the articles to be dried.

BRIEF DESCRIPTION OF THE DRAWINGS

The accompanying drawings which are incorporated in and constitute a part of the specification, illustrate an embodiment of the invention and, together with the description, serve to explain the principles of the invention.

DESCRIPTION OF THE PREFERRED EMBODIMENT

Reference will now be made in detail to the preferred embodiment of the present invention, examples of which are illustrated in the accompanying drawings.

By way of example and not limitation, the invention will be described in connection with the drying of semiconductor wafers 36 disposed in cassette 28. The invention, however, is not limited to such use. It can be used to dry a variety of items including, but not limited to, raw silicon, machine parts, numerous types of electrical components, or any other type of article that requires precision drying.

Figure 1:
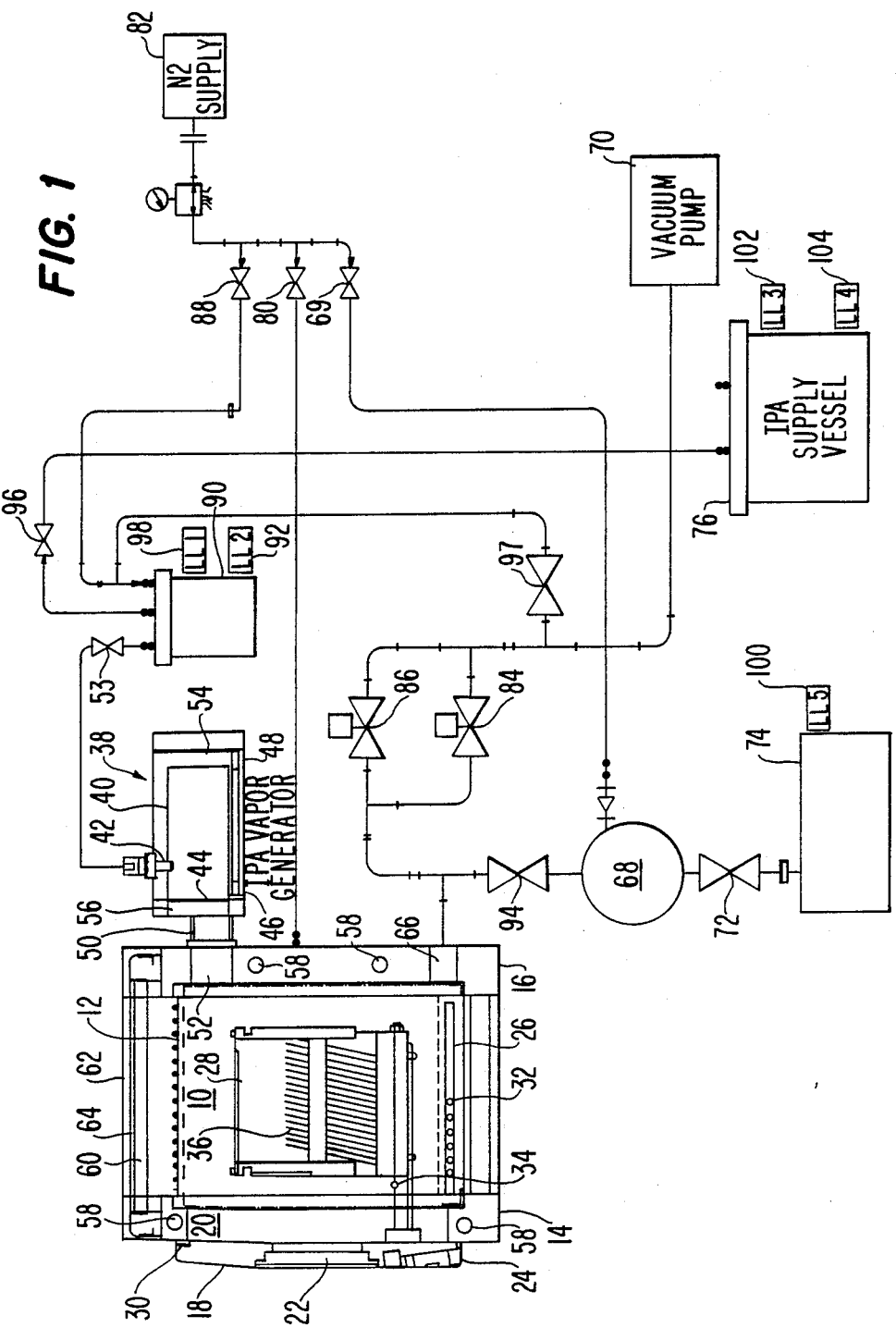
FIG. 1 is a schematic diagram of a drying device in accordance with the present invention.

In accordance with the present invention, there is provided a vacuum process chamber for holding articles to be dried. As shown in FIG. 1, process chamber 10 includes a quartz tube 12 disposed between front bulkhead 14 and rear bulkhead 16. Quartz tube 12 consists of a large diameter (SiO2) tube (the edges of tube 12 are shown as a broken line in FIG. 1), approximately 12 inches in diameter, open at both ends, in which cassette 28 or workholder will reside during the drying process.

Quartz tube 12 is sealed to the front and rear bulkheads 14 and 16, respectively, at the open ends of the tube 12 by vacuum seals such as those made of silicone rubber. Quartz tube 12 is mechanically held in place for a leak tight seal between bulkheads 14 and 16. Quartz is chosen as the material for tube 12 and other components of this system because of its known purity, its absence of trace metal contaminants and other dopants, and its nonreactivity with IPA or deionized water. In addition, quartz transmits infrared light at 95% efficiency at a wavelength of 3 microns which is used in a later dehydration step to complete the wafer drying process.

Figure 2:
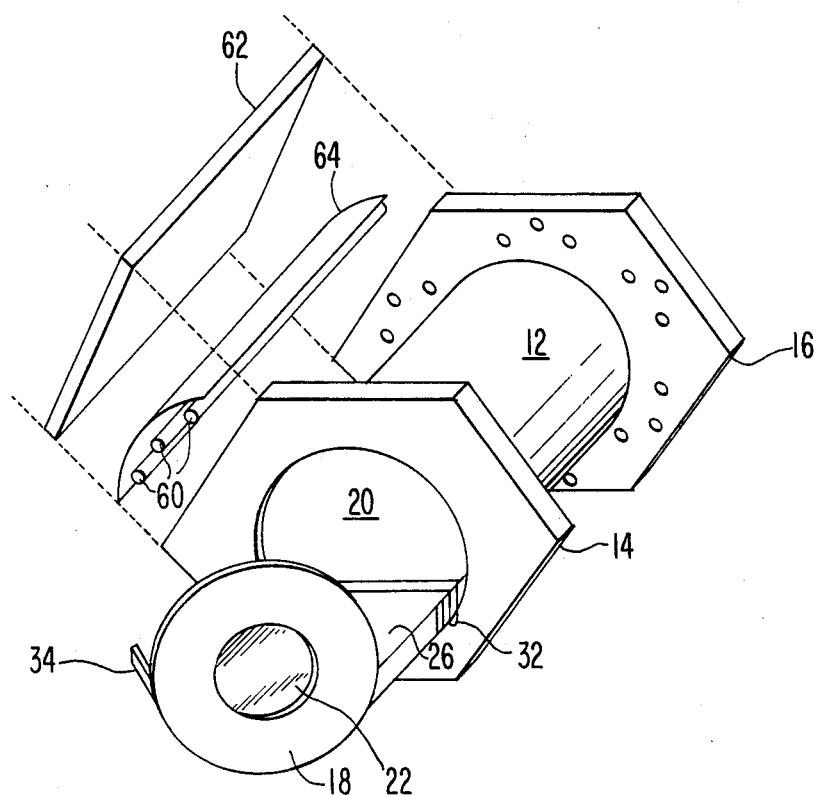
FIG. 2 is a perspective view of the vacuum chamber depicted in FIG. 1.
Figure 3:
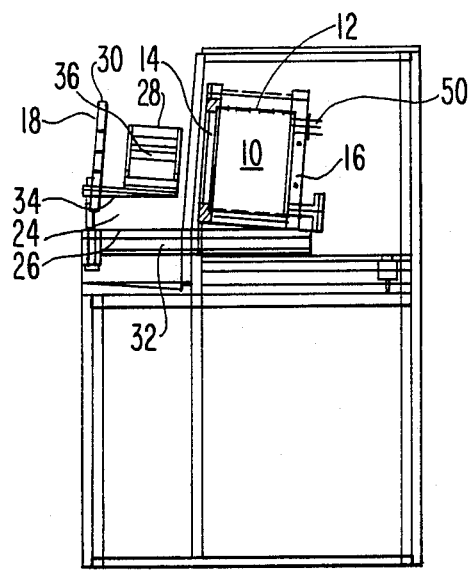
FIG. 3 is a schematic diagram of the process chamber depicted in FIG. 1 with the door opened.
Figure 4:
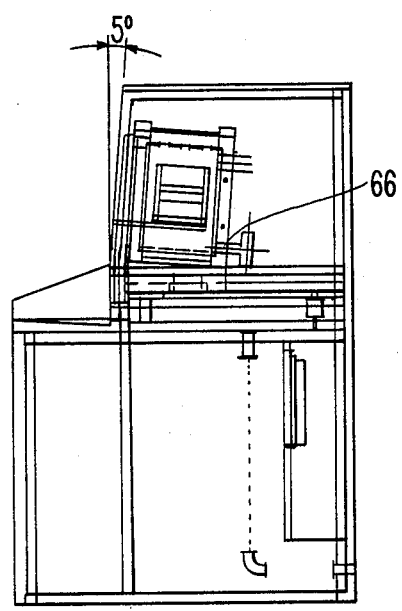
FIG. 4 is a schematic diagram of the process chamber depicted in FIG. 1 with the door closed.
Figure 5:
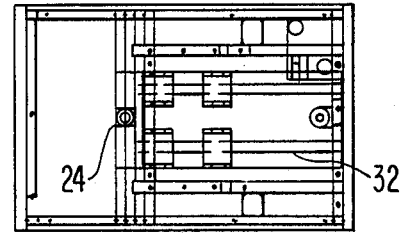
FIG. 5 is a top view of the process chamber shown in FIG. 4.

Front bulkhead 14 is made of a hard anodized aluminum plate with a large opening 20 for use as a cassette passthrough. Front door 18 is pivotably and slidably mounted at opening 20 and includes a hard anodized aluminum plate with a quartz viewing window 22 located in the center of door 18. Window 22 is provided to observe the first wafer in the cassette, however, it is not required for process control. Door 18 pivots on a vertical spindle 24 mounted on sliding drip tray 26, and pivots to facilitate loading and unloading of cassette 28 by either a human operator or a mechanized device or handler. In the closed position, door 18 forms a leak-tight seal with front bulkhead 14 using a silicone rubber O-ring seal 30 affixed to the door. Drip tray 26, on which door 18 pivots, consists of a stainless steel pan disposed under the door mechanism to collect and direct the disposal of dripping water shed from the wet wafer cassette 28 during the loading process. Drip tray 26 is disposed on a linear ball bushing slide mechanism 32 so that the door 18 and tray 26 can be pulled away from front bulkhead 14 as shown in FIG. 2. When door 18 is in the closed position as depicted in FIG. 1, tray 26 is stored beneath quartz tube 12 exterior to the process chamber. This arrangement keeps any water that is shed during the loading process out of the process chamber.

Two arms 34 extend from the interior surface of door 18 and serve as a cassette pedestal for supporting cassette 28 in the process chamber. Arms 34 include two square bars of hard anodized aluminum, oriented with opposite edges in a vertical plane to provide no level surfaces on which liquid water can collect.

The entire process chamber 10 is tilted at approximately a 5° angle with respect to vertical spindle 24. This tilting serves two purposes. First, it causes all of the wafers in cassette 28 to assume the same orientation. This minimizes the surface area on each wafer that contacts cassette 28 and promotes uniform drying. Second, as will be discussed later, it causes any liquid in the chamber to run towards drain port 66.

In accordance with the present invention, there is provided vapor generating means substantially isolated from said process chamber for supplying a substance such as isopropyl alcohol in vapor form to the process chamber. By way of example and not limitation, the invention will be described in connection with the use of isopropyl alcohol (IPA) as the vapor substance. The invention will also function using other volatile low vapor pressure liquids including, but not limited to, various grades of alcohol and chloroflurohydrocarbon.

As embodied herein, vapor generating means includes vapor generator 38. Vapor generator 38 includes quartz tube 40 having inlet 42, outlet 44, and core heaters 46 disposed beneath tube 40. Quartz tube 40 serves as a vapor crucible for holding IPA to be vaporized. Heating mantle 48 surrounds tube 40 and consists of aluminum housing 54 at one end and a bolt-up end plate 56 at the other end. This arrangement facilitates easy cleaning of quartz tube 40 by simply removing end plate 56. In addition to housing quartz tube 40 and core heaters 46, heating mantle 48 encloses and contains quartz tube 40 to provide a measure of safety in the event of an accidental tube explosion or implosion.

IPA enters tube 40 through inlet 42 and is boiled by two core heaters 46 disposed in heating mantle 48 below quartz tube 40. Temperature controllers (not shown) are provided for regulating the heat of core heaters 46. As the IPA boils, IPA vapor escapes from quartz tube 40 through outlet 44 and enters process chamber 10 through aluminum transfer tube 50 disposed between the outlet 44 of vapor generator 40 and the inlet 52 of process chamber 10. Valve 53 disposed between IPA reservoir 54 and vapor generator 38 regulates the amount of IPA that enters the vapor generator and thereby regulates the rate at which vapor is produced. Preferably, valve 53 is adjusted so that IPA enters quartz tube 40 at a rate that allows IPA to vaporize immediately.

Vapor generator 38 and the process chamber 10 are isolated from each other so that water or other rinsing liquid shed by drying wafers 36 is not vaporized by the vapor generator. This feature assures that the water moisture concentration of the IPA vapor in process chamber 10 remains at a minimum. Isolating vapor generator 38 from the interior of process chamber 10 also assures the purity of the IPA vapor in the vapor generator, keeping water shed from the drying wafers out of the IPA supply.

Also in accordance with the invention, there is provided means disposed proximate to said process chamber for preventing said substance vapor from condensing on the inside walls of said process chamber. As embodied herein, the preventing means includes two core heaters 58 disposed in both the front and rear bulkheads 14 and 16, respectively. Alternatively, core heaters 58 can be placed in door 16 instead of in front bulkhead 14. Core heaters 58 are controlled by temperature controllers (not shown). Because alcohol vapors will preferentially condense on the coolest surface, it is important that the front and rear bulkheads not be the coolest surface in the process chamber. Core heaters 58 and their respective controllers are used to keep the temperature of the bulkheads 14 and 16 above the temperature of the wafers.

In accordance with the invention, the vapor dryer may also include heating means for aiding in vaporizing liquid from the articles. As embodied herein, heating means includes six infrared quartz heaters 60 placed circumferentially around quartz tube 12 of process chamber 10. Gold plated reflectors 64 intimately surround the quartz heaters to direct infrared heat to wafers 36. Depending upon the type of articles being dried and the drying requirements, quartz heaters 60 may be activated during the drying cycle to aid in vaporizing any remaining alcohol and/or water remaining on the articles in the process chamber. As embodied herein, heating means may also include outer reflector/shield 62 which consists of an electropolished stainless steel circumferential skin that forms the outer body of the process chamber 10. Reflector/shield 62 serves two purposes. First, it reflects the infrared light of quartz heaters 60 into the process chamber, and second, it contains the energy from an accidental implosion or explosion of quartz tube 12.

The vapor dryer according to the invention may also include evacuation means for removing said substance and water from the process chamber. As embodied herein, evacuation means includes drain port 66 connected to intermediate drain tank 68. The 5° tilt of process chamber 10 causes any spent water and IPA to drain out of the process chamber through drain port 66. Intermediate drain tank 68 is of small volume capable of holding the maximum amount of spent liquid from a single drying cycle. At the end of each drying cycle, valve 72 is opened and intermediate drain tank 68 is drained into primary drain tank 74. This arrangement minimizes any exposure between the relatively large volume of refuse in primary drain tank 74 and process chamber 10.

The process cycle will now be described in connection with FIG. 1. To begin the cycle, assume the machine is started up and running in a continuous mode, i.e., up to temperature, IPA supply vessel 76 not empty, vacuum pump 70 on and in tolerance, previously dried cassette 28 in ambient pressure in nitrogen in the process chamber with door 18 and all valves closed except nitrogen vent value 80.

Valve 80 is open to vent the process chamber to atmosphere or slight positive pressure from desiccated chamber or low pressure nitrogen source 82. Door 18 is then unlocked (either manually or mechanically) and opened to the position shown in FIG. 2. The dried cassette 28 is removed and a wet cassette is then placed on arms 34 of door 18. Door 18 is then closed and locked and a start button is pressed activating a computer sequencer.

The following steps are performed by the sequencer but could also be performed manually. First, heaters 48 of vapor generator 40 are activated. Alternatively, the heaters 48 may remain on from cycle to cycle. Next, valve 80 is closed and the vacuum chamber is slowly evacuated by vacuum pump 70, by slowly opening soft start vacuum valve 84 until a first intermediate vacuum of, for example, 500 Torr is reached. As process chamber 10 is being evacuated, valve 94 located between drain port 66 and intermediate drain tank 68 is open. This allows water shed from wafers 36 to drain via gravity from the process chamber. Once the vacuum set point of 500 Torr has been reached, soft start vacuum valve 84 is closed and primary vacuum valve 86 is opened until a second intermediate vacuum of, for example, 50 Torr is reached. This two step vacuum procedure minimize rattling of wafers 36 in cassette 28. Next, valves 53 and 88 are simultaneously opened and primary vacuum valve 86 is closed. This allows the vacuum of the process chamber to draw IPA from IPA measuring reservoir 90 into vapor generator 38 and to prevent the generated vapor from being drawn out of processing chamber 10.

As the level of IPA in measuring reservoir 90 decreases, measuring reservoir 90 is back-filled with nitrogen from nitrogen supply 82. Nitrogen is used as a backfill because of its clean characteristics and low cost. However, other inert gases as well as purified air can also be used as back-fill. Valve 53 remains opened until the IPA measuring level in the IPA reservoir 90 drops below low level sensor 92. When this occurs, valves 53 and 88 are closed. This substep draining IPA vapor into the chamber may be repeated a number of times to rinse and cleanse the wafers. In the alternative, a larger IPA reservoir may be to provide a sufficient volume for rinsing.

Heaters 48 of vapor generator 40 remain on for a preset period of time that is long enough to insure that all of the IPA in vapor generator 38 is boiled. After the preset period of time has elapsed, valve 94 disposed between intermediate drain tank 68 and process chamber 10 is closed. At the same time, quartz heaters 60 are turned on and soft start vacuum valve 84 is opened until the vacuum again reaches the second intermediate vacuum of, for example, 50 Torr. At this set point, soft start vacuum valve 84 is closed and primary vacuum valve 86 is opened until the vacuum reaches, for example, 1 Torr or less. Valve 86 is then closed, the pressure remains substantially constant, and quartz heaters 60 remain on until a preset period of time passes to insure that complete dehydration has taken place. At that time, valve 80 disposed between nitrogen supply 82 and process chamber 10 is opened. Valve 80 remains opened until the pressure inside process chamber 10 reaches ambient atmospheric pressure.

Prior to the end of the cycle, valve 72 disposed between primary drain tank 74 and intermediate drain tank 68 is opened to drain intermediate drain tank 68. Valve 69 disposed between nitrogen supply 82 and intermediate drain tank 68 is also opened to provide back-fill. In addition, valve 96 is opened between IPA reservoir 90 and IPA supply vessel 76, and valve 97 between vacuum pump 70 and IPA measuring reservoir 90 is also opened. This allows vacuum pump 70 to draw IPA from supply vessel 76 into IPA reservoir 90 to refill the reservoir. Valves 96 and 97 remain open until the IPA in the measuring reservoir 90 reaches upper level sensor 98. At this point, the cycle ends, all valves close, and door 18 may be opened to remove the dried wafers.

Upper primary drain tank sensor 100 and upper and lower IPA supply vessel sensors 102 and 104, respectively, are provided to warn the operator and/or send a signal to the sequencer that a critical level has been reached.

Additional advantages and modifications will readily occur to those skilled in the art. The invention in its broader aspects is, therefore, not limited to the specific details, representative apparatus and illustrative example shown and described. Accordingly, departures may be made from such details without departing from the spirit or scope of the general inventive concept as defined by the appended claims and their equivalents.

What is claimed is:

1. A device for drying articles, comprising:
   a vacuum process chamber for holding articles to be dried and for maintaining a sub-atmospheric pressure environment;
   vapor generating means substantially isolated from said process chamber for supplying a substance in vapor form to said process chamber;
   means disposed proximate said process chamber for discouraging said substance vapor from condensing on the inside walls of said process chamber, and heating means for aiding in the vaporizing of liquid molecules from the articles.

2. A device according to claim 1, further comprising evacuation means for removing said substance and water from the vacuum process chamber.

3. A device according to claim 1, where said vacuum process chamber includes a quartz liner.

4. A device according to claim 1, wherein said vapor generating means includes a vapor crucible substantially isolated from said process chamber for holding said substance, means for boiling said substance in said vapor crucible, and means for transmitting the vapor of said substance from said vapor crucible to said vacuum process chamber.

5. A device according to claim 4, wherein said vapor crucible has an inner surface made of quartz.

6. A device according to claim 4, wherein said means for boiling includes at least one heater for conducting heat to said vapor crucible and at least one temperature controller for controlling said heater.

7. A device according to claim 4, wherein said vapor generating means further includes a measuring reservoir connected to said vapor crucible for supplying said substance to said vapor crucible.

8. A device according to claim 7, further including means for back-filling said measuring reservoir with an inert gas as the substance is removed.

9. A device according to claim 8, wherein said inert gas is nitrogen.

10. A device according to claim 1, wherein said means for preventing said substance vapor from condensing on the inside walls of said process chamber includes at least one wall heater for transmitting heat to said inside walls of said process chamber.

11. A device according to claim 1, wherein said heating means includes infrared heating elements.

12. A device according to claim 1, wherein said substance is isopropyl alcohol.

13. A device for drying articles, comprising:
a vacuum process chamber for holding articles to be dried;
a vapor crucible substantially isolated from and connected through a conduit to said process chamber, said vapor crucible for holding a substance;
a heater disposed proximate said vapor crucible for causing said substance to boil in said vapor crucible;
a pump for evacuating air from said process chamber and for drawing the vapor of said boiling substance through said conduit and into said process chamber;
at least one wall heater for heating the inside walls of said process chamber;
infrared heaters to aid in vaporizing liquid and said substance from the drying articles;
a substance reservoir connected to said vapor crucible for supplying said substance to said vapor crucible; and
a drainage system connected to said process chamber for evacuating and holding said substance and liquid removed from said drying articles.

14. A device according to claim 13, wherein said substance reservoir is connected to a supply vessel for supplying said substance to said substance reservoir.

15. A device according to claim 13, wherein said process chamber and said vapor crucible include inside walls made of quartz.

16. A device according to claim 13, wherein said drainage system includes an intermediate drain tank connected to said process chamber, and a primary drain tank connected to said intermediate drain tank.

17. A device according to claim 13, wherein said vacuum process chamber includes an opening and a door disposed on said opening, said door being slidable in a direction substantially perpendicular to the plane of said door opening.

18. A device according to claim 16, further including a drip tray slidable with and disposed substantially perpendicular to said door, said drip tray being disposed outside of said process chamber when said door covers said opening.

19. A device according to claim 16, wherein the door further includes cassette supports extending from the interior surface thereof.

20. A method for drying articles in a process chamber after the articles have been washed in a liquid, the method comprising the steps of:
evacuating air from the process chamber to maintain a sub-atmospheric pressure substantially gaseous environment in the process chamber;
supplying vapor of a substance to said process chamber from a source external to said process chamber while the sub-atmospheric pressure environment is maintained;
heating the inside walls of the process chamber to discourage the substance from condensing on the walls of the process chamber; and
evacuating liquid from the process chamber.

21. A method according to claim 20 further comprising the step of heating the articles to aid in vaporizing liquor thereon.

22. A method according to claim 20, further comprising the step of heating the article to be dried.

23. A method according to claim 20, wherein the step of evacuating air is accomplished at a controlled rate to prevent damage to the articles in said process chamber.

24. A method according to claim 20, wherein the step of supplying vapor includes the substeps of boiling said substance in a vapor crucible and conducting the vapor of said boiling substance to said process chamber.

25. A method according to claim 24, wherein the substep of boiling includes continuously supplying controlled quantities of said substance to said vapor crucible.

26. A method according to claim 25, wherein said substance is boiled substantially instantaneously upon entering said vapor crucible.

27. A method according to claim 22, wherein the step of heating is performed after the step of supplying vapor is complete.

28. A method according to claim 20, wherein the step of evacuating air is performed both before and after the step of supplying vapor.

29. A method according to claim 20, wherein the liquid is deionized water and said substance is isopropyl alcohol.

30. A method according to claim 20 wherein the step of supplying vapor includes supplying quantities of vapor sufficient to rinse and cleanse said articles.

* * * * *